United States Patent [19]

Tigelaar et al.

[11] Patent Number: 4,894,693
[45] Date of Patent: Jan. 16, 1990

[54] SINGLE-POLYSILICON DRAM DEVICE AND PROCESS

[76] Inventors: Howard L. Tigelaar, 505 Meadowcreek Dr., Allen, Tex. 75002; Roger A. Haken, 4236 Goodfellow Dr., Dallas, Tex. 75229; Thomas C. Holloway, 7007 Walling La., Dallas, Tex. 75231

[21] Appl. No.: 938,486

[22] Filed: Dec. 5, 1986

Related U.S. Application Data

[63] Continuation-in-part of Ser. No. 837,611, Mar. 7, 1986, abandoned, and a continuation-in-part of Ser. No. 729,318, May 1, 1985, Pat. No. 4,821,085.

[51] Int. Cl.$^4$ .................... H01L 29/78; H01L 27/02; H01L 29/04; H01L 23/48
[52] U.S. Cl. .................................. 357/23.6; 357/42; 357/59; 357/67
[58] Field of Search ............... 357/23.6, 42, 59 I, 357/67

[56] References Cited

U.S. PATENT DOCUMENTS

| | | | |
|---|---|---|---|
| 4,178,605 | 12/1979 | Hsu et al. | 357/42 |
| 4,240,092 | 12/1980 | Kuo | 357/41 |
| 4,460,911 | 7/1984 | Salters | 357/23.6 |
| 4,475,118 | 10/1984 | Klein et al. | 357/23.6 |
| 4,502,209 | 3/1985 | Eizenberg et al. | 357/71 |
| 4,536,947 | 8/1985 | Bohr et al. | 357/23.6 |
| 4,593,454 | 6/1986 | Baudrant et al. | 357/23.9 |
| 4,605,947 | 8/1986 | Price et al. | 357/23.15 |
| 4,649,406 | 3/1987 | Takemae et al. | 357/23.6 |

FOREIGN PATENT DOCUMENTS 60-55656 3/1985 Japan .
60-74556 4/1985 Japan .
61-35517 2/1986 Japan .
61-142739 6/1986 Japan .

OTHER PUBLICATIONS

Ting, J. Vac. Sci. Technol., 21 (1), May/Jun. 1982, pp. 14–18.
M. Wittmer et al., "Applications of TiN Thin Films in Silicon Device Technology," Materials Research Society Symposium, Nov. 1984, pp. 397–405.
Kaneko et al., "Novel Submicron MOS Devices by Self-Aligned Nitridation of Silicide", *Technical Digest of IEDM*, (IEEE, Dec. 1, 1985), pp. 208–211.
Chen et al., "A New Device Interconnect. Scheme for Sub-Micron VLSI", *Technical Digest of IEDM*, (IEEE, 1984), pp. 118–121.
Alperin et al., "Development of the Self-Aligned Titanium Silicide Process for VLSI Applications," *J. Solid-State Circuits*, (IEEE, Feb. 1985), pp. 61–69.
Tsang, "Forming Thick Metal Silicide for Contact Barrier," IBM Technical Disclosure Bulletin vol. 19, No. 9, Feb. 1977, pp. 3383–3385.
Rideout, "Method of Fabricating MOSFET Integrated Circuits with Low Resistivity Interconnection Lines," IBM Technical Disclosure Bull., vol. 23, No. 6, Nov. 1980, pp. 2563–2566.
De La Moneda, "Self-Aligned Silicide Buried Contacts", IBM Technical Disclosure Bulletin, vol. 24, No. 7A, Dec. 1981, pp. 3454–3457.

*Primary Examiner*—Rolf Hille
*Assistant Examiner*—Robert P. Limanek
*Attorney, Agent, or Firm*—Robert Groover

[57] ABSTRACT

A new DRAM structure, wherein the top plate of the storage capacitor is provided by a TiN thin film layer 410', and the bottom plate is provided by a polysilicon layer 402' which also provides the gates 402 of the pass transistors.

26 Claims, 3 Drawing Sheets

SINGLE-POLYSILICON DRAM DEVICE AND PROCESS

The present invention is a continuation-in-part of Ser. No. 837,611, filed 03/07/86, abandoned, and of Ser. No. 729,318, filed 05/01/85, now U.S. Pat. No. 4,821,085.

CROSS-REFERENCE TO RELATED APPLICATIONS

The following applications, filed simultaneously with the present application, describe related subject matter: Ser. No. 938,654, filed 12/5/86, (entitled *Device and Process with Split Polycide*); and Ser. No. 938,653, filed 12/5/86, (entitled *Device and Process with Doubled Capacitors*); and Ser. No. 938,699, filed 12/5/86, (entitled *Device and Process with TiN-gate Transistor*).

BACKGROUND AND SUMMARY OF THE INVENTION

The present invention relates to integrated circuits and to methods for manufacturing them.

In a new class of integrated circuit fabrication processes taught by the grandparent application (Ser. No. 729,318, filed 05/01/85, a very novel local interconnect technology was set forth, which resulted in very conveniently produced titanium nitride local interconnect line. These lines can be routed to interconnect p+ substrate regions, n+ substrate regions, and polysilicon in any pattern desired, while also permitting self-aligned silicidation to occur to clad surfaces of exposed silicon substrate areas and also of exposed polysilicon lines with silicide, to improve their conductivity.

In conventional processes for making dynamic random-access memories (DRAMs), the memory cells are formed using two separate polysilicon layers. The first layer is typically used for the gate of the pass transistor, and the second layer is typically used for the top plate of the storage capacitor.

Since thin film deposition steps and patterned etching steps are both significantly expensive process steps, it would be highly desirable to be able to fabricate such devices with a reduced number of polysilicon deposition and etching steps. This would provide reduced fabrication cost, which is most especially important in such "commodity" parts.

The present invention teaches that, as a particularly useful development of the technology taught in the grandparent application, titanium nitride formation can be used to drastically simplify the structure and fabrication of many structures which normally require two levels of polysilicon, and in particular of DRAM memory structures. The present invention teaches that a DRAM memory can be built using only one layer of deposited polysilicon. A patterned dielectric covers some areas of the polysilicon, so that the titanium metal in these areas does not form silicides during the reaction process, but will be converted to a thin film of titanium nitride, which is a very convenient conductor. However, where underlying silicon areas (either of substrate monocrystalline silicon or of polycrystalline silicon) were not protected by this thin dielectric from the deposited titanium, the nitrogen-atmosphere reaction step will form titanium silicide at all such locations. Wherever the titanium metal runs over field oxide or over other non-silicon materials, it will form titanium nitride. This titanium nitride will already be in ohmic contact with any area of exposed silicon it runs over. Thus, simply by patterning this titanium nitride layer, the equivalent of a second polysilicon layer with full buried contact capability is achieved. That is, this layer can make direct contact to n+ or p+ source/drain portions of the substrate wherever (in the periphery) is desired.

Thus, the present invention offers the significant advantage of simpler processing than conventional DRAM memory fabrication methods.

The present invention offers the further advantage that the titanium nitride layer is typically thinner than the second polysilicon layer which can be left out of the process because of the presence of titanium nitride. That is, the bulk resistivity of titanium nitride is low enough that acceptable sheet resistance (for short interconnects) can be achieved for a relatively thin film of TiN ($10\Omega/\square$ or better for a 1000 Angstrom thick TiN film).

The present invention offers yet a further advantage in that the diffusion barrier characteristics of TiN permit this layer to make contacts directly to n+ or p+ silicon or polysilicon, without any problems due to diffusion of dopants through the TiN interconnect to induce counterdoping. This is not the case, for example, with silicides in general.

The present invention also provides an improved capacitor structure, which may be useful, for example, in bootstrapping circuits as well as for storage capacitors of memory cells art. One class of embodiments of the present invention teaches that a single layer containing silicon—in particular, a single layer which consists essentially of silicon at its bottom boundary, to provide the advantageous electrical properties of a silicon/dielectric interface—is used for the bottom plate of capacitors, and also for the gates of insulated gate field effect transistors. A titanium nitride thin film interconnect layer is used for the top plates of capacitors, and preferably also for local interconnect. The portions of the thin film titanium nitride layer which are used for local interconnect can link polysilicon, silicides, and crystalline silicon of any dopant level in any pattern desired. Again, this innovation provides improved topography and also simpler fabrication, resulting in higher yield and lower cost.

Another advantageous use of the TiN layer is to provide pads at the bottom of contact holes. Since the oxide etch chemistries normally used for contact etching are somewhat selective to TiN this layer provides some protection against overetching when the contact etch step must etch contact holes of various thicknesses. In particular, the present invention makes it easier to etch contact holes to substrate and to the polysilicon layer simultaneously. Moreover, the TiN etch stop pads can be extended from the source/drain regions (in the moats) up onto the field oxide so that the contact hole does not have to fall within the perimeter of the source/drain, but can overlap up onto the field oxide. This means that the source/drain patterns can be drawn smaller, providing a further advantage of the invention.

Yet another use of the TiN layer provided by the presently preferred embodiments of the present invention is to provide capacitors to substrate. Since the interlevel dielectric is patterned after the source/drain implants, these capacitors can be located over heavily doped diffusions, so their parasitic series resistance should not be large.

Yet another use of the TiN layer provided by the presently preferred embodiments of the present invention is to provide Schottky diodes to substrate. By screening the source/drain implant from some areas of bare silicon, the TiSi$_2$/TiN layer formed on these areas will provide usable Schottky diodes.

Thus, the present invention provides a DRAM cell which can be fabricated by a much simpler process than is conventionally used, with no degradation in device performance. In some embodiments, this DRAM cell also is more nearly planar than the cells of the prior art, which further increases the yield by decreasing the risk in subsequent process steps; e.g., there is less danger of filaments when the metal level is etched.

According to the present invention there is provided: An integrated circuit memory comprising: a substrate, including device isolation regions defining moat areas of exposed semiconducting material; a plurality of memory cells, each said cell comprising an insulated-gate field effect pass transistor having a channel and first and second source/drains in a respective one of said moat areas, and a storage capacitor having a lower plate a capacitor dielectric and an upper plate insulated from said lower plate by a capacitor dielectric, said plates substantially overlying said device isolation regions, said first source/drain of said pass transistor being connected through a local interconnect to said upper plate of said storage capacitor; said gates of ones of said pass transistors and said bottom plates of ones of said capacitors comprising respective portions of a first patterned thin film conductive layer which is polycrystalline and comprises more than 30% atomic of silicon; said local interconnects and said top plates of ones of said capacitors comprising respective portions of a second patterned thin film conductive layer consisting predominantly of titanium nitride; at least one bitline connected to respective ones of said second source/drains of said pass transistors; and at least one wordline connected to respective ones of said gates of said pass transistors.

According to the present invention there is also provided: An integrated circuit memory comprising: a substrate including areas of crystalline semiconducting material; a plurality of memory cells, each said cell comprising an insulated-gate field effect pass transistor having a channel and first and second source/drains in said semiconducting material, and a storage capacitor having a lower plate, a capacitor dielectric, and an upper plate insulated from said lower plate by a capacitor dielectric, said bottom plate overlying said semiconducting material and being separated therefrom by a field plate dielectric, said first source/drain of said pass transistor being connected through a local interconnect to said upper plate of said storage capacitor; said gates of ones of said pass transistors and said bottom plates of ones of said capacitors comprising respective portions of a first patterned thin film conductive layer which is polycrystalline and comprises more than 30% atomic of silicon; said local interconnects and said top plates of ones of said capacitors comprising respective portions of a second patterned thin film conductive layer consisting predominantly of titanium nitride; at least one bitline connected to respective ones of said second source/drains of said pass transistors; and at least one wordline connected to respective ones of said gates of said pass transistors.

BRIEF DESCRIPTION OF THE DRAWINGS

The present invention will be described with reference to the accompanying drawings, wherein.

DESCRIPTION OF THE PREFERRED EMBODIMENTS

The making and use of the presently preferred embodiments will now be discussed in great detail. However, it should be appreciated that the present invention provides widely applicable inventive concepts, which can be embodied in a tremendous variety of specific contexts; the specific embodiments discussed are merely illustrative of specific ways to make and use the invention, and do not delimit the scope of the invention.

The present invention enables an improved single-transistor DRAM cell, using only a single layer of polysilicon. For example, the polysilicon layer can be used for the capacitor bottom plate and for the gates of pass transistors. Since the capacitor is over field oxide it will have better charge retention and will save area. An interlevel oxide/nitride is deposited and patterned, as described above, so that it is removed from gates and source/drains of the pass transistors. A direct reaction step, like that described above, is now used to form titanium silicide on gates and source/drains of the pass transistor, and form titanium nitride as the top plate of the capacitor. The TiN is patterned and etched to keep TiN as the top plate of the capacitor and to connect the top plate of the capacitor to the drain of the pass transistor. (In the preferred embodiment of this design, the roles of the bottom and top capacitor plates are opposite to current designs. The polysilicon storage plate is held at 5 V, and the charge is stored on the TiN plate, which is almost completely encased in dielectric except for the drain connection. However, alternatively and less preferably, the storage plate could be held at ground instead.) Thus, this embodiment advantageously provides a DRAM cell which is more compact and has lower leakage than conventional DRAM cells, and yet can be made using a much simpler fabrication process.

Figure 4A:
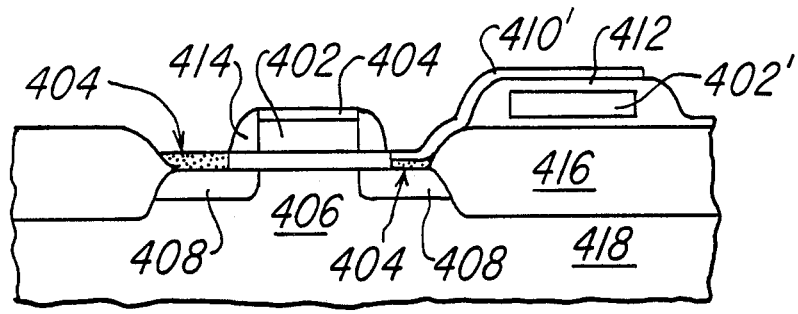
FIGS. 4A and 4B show examples of DRAM cells built according to the present invention, wherein only one level of polysilicon is required.
Figure 4B:
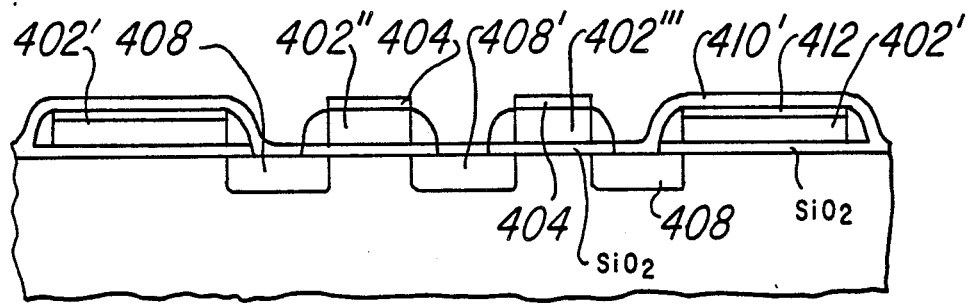
Figure 5:
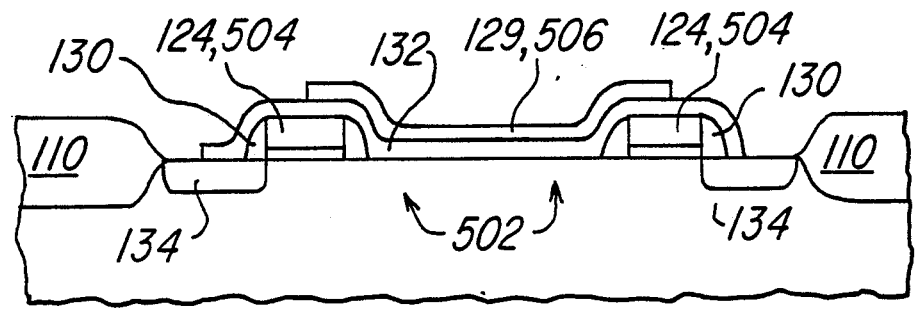
FIG. 5 shows a sample high-voltage insulated gate field effect transistor, (constructed, using only one level of polysilicon, in the same process flow as conventional devices like those of FIG. 1B) where the gate consists predominantly of titanium nitride, and (in the example shown) a split-gate structure is used.

Examples of this class of embodiments are shown in FIGS. 4A and 4B. In FIG. 4A, polysilicon layer 402 (capped with TiSi$_2$ 404, as are the source/drain diffusions 408) provides the gate of the pass transistor 406. One of the source/drain diffusions 408 provides a diffused bit line, and a local interconnect line 410, which predominantly comprises TiN (which may be offstoichiometric, as discussed elsewhere), makes ohmic contact to the other source/drain diffusion 408 to and extends to form top capacitor plate 410'. The capacitor dielectric is a composite oxide/nitride layer 412, and the bottom plate of the capacitor is provided by another polysilicon plate 402' (which is another portion of the same thin film layer which provides the gate 402, and which sits on top of a field oxide 416 (preferably underlain by a channel stop implanted 418)). The polysilicon plate 402', however, is not clad by a silicide layer since it is covered by the dielectric 412 when the titanium metal is deposited. Polysilicon regions 402 and 402' are ringed by sidewall oxide filaments 414, which prevent shorting at the corners of the gates 402.

FIG. 4B shows a different class of embodiments, wherein the capacitor bottom plate 402' also provides field plate isolation (that is, the bottom plate 402' is held at an average voltage which keeps the silicon beneath it depleted, so that the parasitic MOS transistor beneath this plate is kept turned off, preventing lateral leakage currents). FIG. 4B shows two bits of memory: the pass gate 402'' is separate from the pass gate 402''', so that bit line diffusion 408' can act as the source of either of the two pass transistors shown. This embodiment is particularly advantageous in that it is not necessary to grow the field oxide 416, so that the corresponding penalty of lateral encroachment (and area inefficiency) is avoided. It is most preferable to hold the polysilicon 402' at 5 V (or at $V_{DD}$, if less than 5 V), since this permits designers to use familiar sense level amplifiers; to accomplish the silicon below polysilicon plates 402' must have a doping level such that it will not turn on when 5 V is applied to the plate 402'. Most preferably, this is done by performing a masked implant to increase the threshold voltage under polysilicon plates 402' (or under enough of plates 402' to provide good isolation), but not under polysilicon gates 402'' and 402'''.

The dielectric under the field plates 402' is preferably the same as the gate oxide (for process simplification); but alternatively an additional masking step could be used to provide a dielectric which is thicker and/or has a different composition than the gate dielectric.

Figure 6:
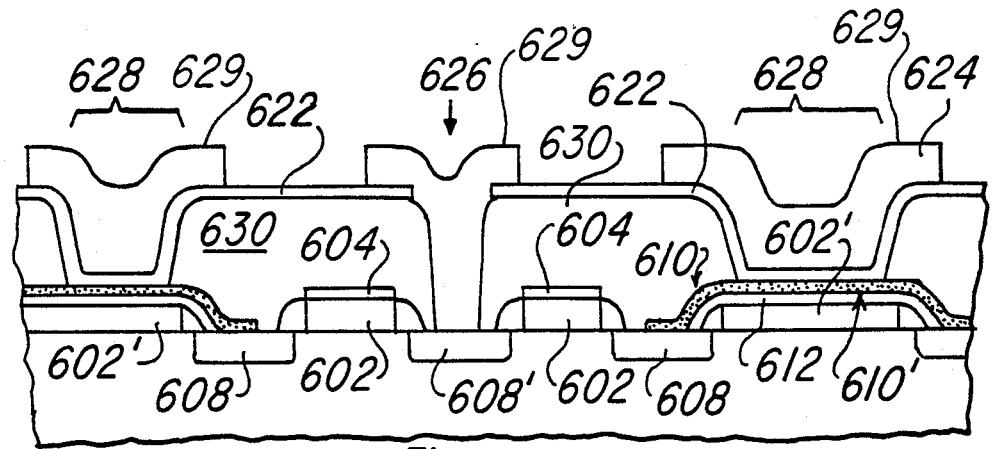
FIG. 6 shows an example of a stacked capacitor structure constructed using only one level of polysilicon.

Another class of embodiments to achieve increased capacitance is shown in FIG. 6. In this sample embodiment, pass transistor gates 602 (which are polysilicon clad by silicide 604) permit connection of a first source/drain 608' to either of second source/drains 608, which are ohmically contacted by respective local interconnect lines 610 (which predominantly comprise TiN (which may be off-stoichiometric, as discussed elsewhere)), which extend to form middle capacitor plates 610'. The lower capacitor dielectric is a composite oxide/nitride layer 612, and the bottom plate of the capacitor is provided by another polysilicon plate 602' (which is another portion of the same thin film layer which provides the gates 602). (Polysilicon regions 602 and 602' are ringed by sidewall oxide filaments 614 to prevent shorting and improve topography). The middle capacitor plate 610' is also capacitively coupled, through upper capacitor dielectric 622, to a capacitor top plate 624 in metal. To fabricate this embodiment, after the polysilicon, silicide, and local interconnect structures have been formed, interlevel dielectric 630 is deposited and planarized, and a two-step contact etch process is performed. First, large contact windows 628 are etched down to the local interconnect (titanium nitride) layer 610' in desired capacitor locations, and an oxide/nitride layer (preferably) is deposited to form the upper capacitor dielectric 622. Another masked contact etch is then used to cut contacts to moat (in this example, to diffusion 608') or (if desired) to polysilicon 602, in predetermined ohmic contact locations. Metal 628 (e.g. Al:Si) can then be deposited and etched to produce a structure such as that shown.

Figure 1A:
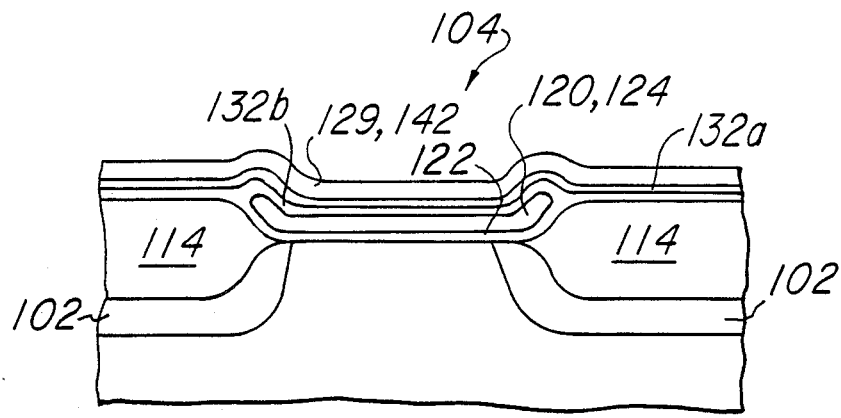
FIG. 1A shows a sample floating gate memory cell constructed using only one level of polysilicon.

Details of a sample process flow to provide the partially split polycide layer used in the present invention will now be given. The particular steps specified will provide an EPROM like that shown in FIG. 1A; adaptation of the key steps to fabrication of a DRAM structure as shown in FIG. 4A or 4B is straight-forward. Routine and obvious steps, such as cleanups, bakes, ashes, and deglazes are generally not specifically detailed.

1. Tank formation: the following steps are used to define n-wells (PMOS device regions) 106 and p-wells (NMOS active device regions) 108 for the peripheral devices:
 (a) The starting material is 12–15 $\Omega$-cm p-type epitaxial material, which is 12–15 microns thick and has (100) orientation, on a P+ substrate (0.01–0.02 $\Omega$-cm).
 (b) An oxide/nitride stack is formed and patterned, and Phosphorus is implanted (with the photoresist still in place) to form the n-wells 106.
 (c) A thick "color reversal oxide" is then grown to define the p-well pattern as (essentially) the complement of the n-well pattern, and the nitride is then stripped to expose clean bare silicon where not protected by the color reversal oxide.
 (d) Boron-11 is then implanted to form the p-wells 108, and the color reversal oxide is then stripped.
 (e) The tank implants are then activated and driven in.

2. Formation of moats (i.e. regions, surrounded by field oxide 110, where the peripheral active devices will be formed) now proceeds.
 (a) Silicon nitride is now deposited and etched in a pattern which leaves nitride in the regions where active devices will be formed (and also over the entire array of non-volatile memory transistors 104), and Boron-11 is implanted to form the channel stop 112 under the field oxide regions 110.
 (b) A 900 C steam oxidation step is then performed to grow 9500 A of oxide, which will form the field oxide isolation regions 110 which separate the moat regions from one another. (Note that these field oxidation regions 110 are used only in the periphery; the self-aligned thick oxides 114 which form the bitline insulator strips over buried n+ regions 102 in this embodiment will be formed later.)

3. The bitline diffusions 102 will now be formed.
 (a) The buried n+ pattern is defined in photoresist, to expose the locations of the bitline diffusions 102.
 (b) A plasma etch is now used to clear the remaining nitride from the bitline diffusion locations and Arsenic is implanted (e.g. 50 keV, 5.0E15 cm$^{-2}$) to form the bitline diffusions 102.
 (c) The implanted n+ regions are then annealed, and a self-aligned thick oxide 114 is grown, by 100 minutes in Argon at 900 C, followed by a 900 C steam oxidation for long enough to grow 4500 A of oxide over the buried n+ regions (about 40 minutes).
 (d) The remaining nitride is then stripped, using a 1% HF deglaze followed by hot phosphoric acid, and the pad oxide under the nitride is also stripped using a quick dip in 1% HF.

4. The gates of the peripheral devices 116 and 118, and the floating gates 120 of the floating-gate non-volatile transistors 104 in the memory array, will now be formed.
  (a) A dummy gate oxidation (anti-Kooi-effect oxidation) is now performed at 900 C in steam, to grow 350 A of oxide.
  (b) Photoresist is now patterned to mask the first threshold voltage adjusting implant ($V_{TA}$-adjust), and the threshold voltages of the floating-gate transistors 104 are adjusted by appropriate implantation.
  (c) The photoresist is stripped (e.g. in $H_2O_2/H_2SO_4$).
  (d) The dummy gate oxide is stripped in a 1% HF dip. (In this and other deglaze steps, the time in HF is preferably minimized to avoid excessive loss of the thick oxide over buried n+ (the bitline isolation oxide)).
  (e) A gate oxidation step is now performed, at 900 C in steam, to form 400 A of oxide 122.
  (f) Boron-11 is now implanted (35 keV, .5E11 cm$^{-2}$) to adjust the thresholds of NMOS devices in the periphery.
  (g) Photoresist is now patterned to expose only the channels of PMOS devices, and boron-11 is again implanted (35 keV, 9E11 cm$^{-2}$) to adjust the thresholds of PMOS devices in the periphery.
  (h) The photoresist is stripped.
  (i) The first patterned thin film conductor layer 124 is now formed, by LPCVD deposition of polysilicon to a thickness of 3000 A, and doped to 100 $\Omega/\square$ by 20 minutes in a $POCl_3$ atmosphere at 850 C.
  (j) Photoresist is now patterned to define the gates 126 of NMOS devices 116 in the periphery, gates 128 of PMOS devices 118 in the periphery, and the floating gates 120 of the non-volatile transistors 104 in the memory array, and the polysilicon level is etched (using, e.g., an HCl/HBr plasma etch chemistry) accordingly. The remaining photoresist is then stripped.
  (k) 2500 Å of oxide is then deposited by LPCVD from a vapor containing tetraethylorthysilane, and anistropically etched to form sidewall filaments 130 shown) of almost 2500 Å maximum thickness.
  (l) An interlevel dielectric 132 is now deposited by LPCVD in a single step at 800 C: 150 Å of oxide is followed by 250 Å of nitride.

5. Source/drain regions 134 and 136 in the periphery will now be formed.
  (a) Photoresist is patterned to expose the source/drain regions 134 of the NMOS devices in the periphery, and As is implanted (150 keV, 5E15 cm$^{-2}$) followed by P (100 keV, 4E14 cm$^{-2}$).
  (b) Another patterned photoresist layer is now used to expose the PMOS source/drain regions 136, and boron-11 is implanted (40 keV, 3.0E15 cm$^{-2}$).
  (c) The photoresist is now stripped.
  (d) The source drain implants are annealed by a 900 C furnace treatment (Ar for 60 minutes, then $O_2$ for 30 minutes, then Ar for 10 minutes).
  (e) The interlevel dielectric 132 is now etched away in the periphery, using a mask which covers the whole array. If capacitors are desired outside the array, the interlevel dielectric 132 is simply left in place over the first patterned thin film conductor layer 124 in those locations.
  (f) Photoresist is then stripped.

6. The TiN layer 129 will now be formed, to provide local interconnects 140 in the periphery and to form the control gates 142 of the non-volatile transistors 104 in the array.
  (a) 1000 Å of pure titanium is deposited overall.
  (b) A silicon nitride/silicon dioxide cap layer (e.g. 400 Å $Si_3N_4$ over 800 Å $SiO_2$) is deposited overall.
  (c) The wafer is heated (e.g. to 675 C for 30 min) to cause $TiSi_x$ 144 to form on areas where the titanium is in contact with silicon.
  (d) The nitride/oxide cap layer is plasma etched so that it protects the conductive titanium compounds beneath it in desired locations of local interconnects 140, and also in the predetermined locations of control gates 142 in the memory array. (As discussed below, the titanium in these locations will be an oxygen-doped titanium-rich off-stoichiometric titanium nitride.) This single patterned etch step defines locations of control gates (of non-volatile memory transistors), local interconnects, and (if used) capacitors.
  (e) The unreacted titanium (and nitride/oxide filaments) are selectively stripped by wet chemical etch.
  (f) A p-type bitline isolation implant (which will be self-aligned, i.e. screened by the bitline insulator strips (thick oxide) and by the TiN wordlines) is now performed, to provide increased p-type doping to separate adjacent transistors in the same column.
  (g) Photoresist is then stripped, and the wafer is annealed (800 C, 30 min, nitrogen atmosphere) to lower the sheet resistance of the silicides 144.
  (h) A conformal oxide layer is now deposited overall, e.g. 1000 Å of TEOS oxide, to prevent outdiffusion of dopant species from the following the MLO layer into the contacts.

Figure 1B:
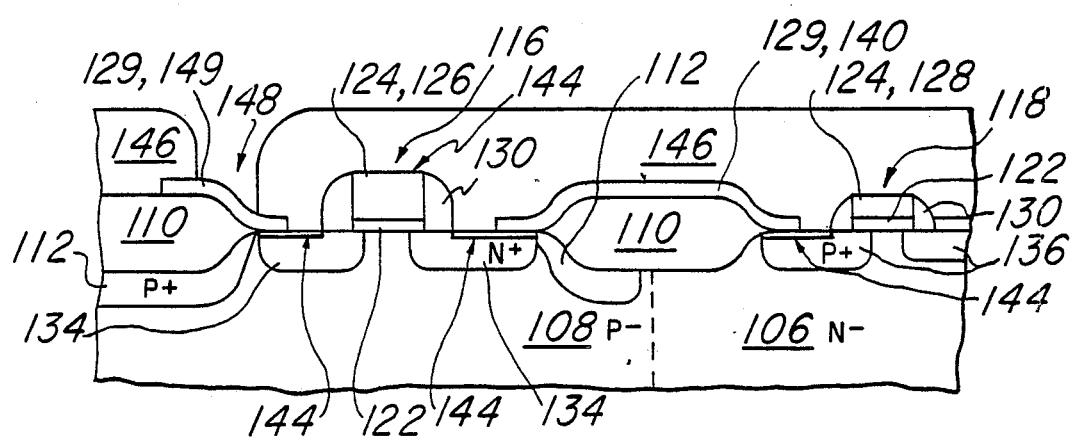
FIG. 1B shows a sample embodiment of CMOS peripheral logic devices, which are integrated on a common chip with an array of memory cells such as that shown in FIG. 1A to provide addressing and sensing logic.

7. Contacts are now formed.
  (a) The MLO 146 is deposited: for example, a borophosphosilicate glass (BPSG) containing approximately 4.5% boron and also about 4.5% phosphorus is used.
  (b) A 900 C furnace step (30 minutes in argon) is used to densify the BPSG 146.
  (c) Photoresist is applied and patterned to expose the locations of contact holes 148, the contact holes are etched, and the remaining resist is stripped. Note that this step too applies principally to the periphery: there are preferably no contacts in the memory array, except for occasional metal to TiN contacts used for strapping the word lines. Preferably contact pads 149 (provided by patterned portions of the second patterned thin film conductive layer (local interconnect layer) 129, which preferably comprises a large fraction of titanium nitride to advantageously provide an etch stop and diffusion barrier) are included at the bottom of contact holes 148, as shown in FIG. 1B.

8. Processing continues conventionally with metal patterning, for the peripheral devices only.
  (a) A deglaze in 1% HF is used to get good metal adhesion, and metal is then deposited by sputtering.
  (b) A dyed photoresist is deposited and patterned, the metal is plasma etched, and the resist is stripped.
  (c) The structure is heated to 450 C in $H_2$ for 30 minutes to sinter the metal and lower its contact resistance.

9. A protective overcoat is now formed:
  (a) 4500 Å of oxynitride dielectric is deposited overall by LPCVD.
  (b) The protective overcoat is covered with a patterned photoresist and etched away to expose metal at contact pad locations, and the photoresist is stripped.

10. Processing concludes with backgrind and backside gold deposition.

Figure 1C:
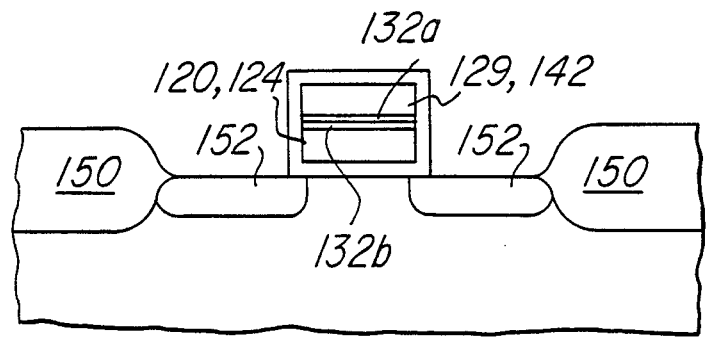
FIG. 1C shows another sample floating gate memory cell constructed using only one level of polysilicon.
Figure 2A:
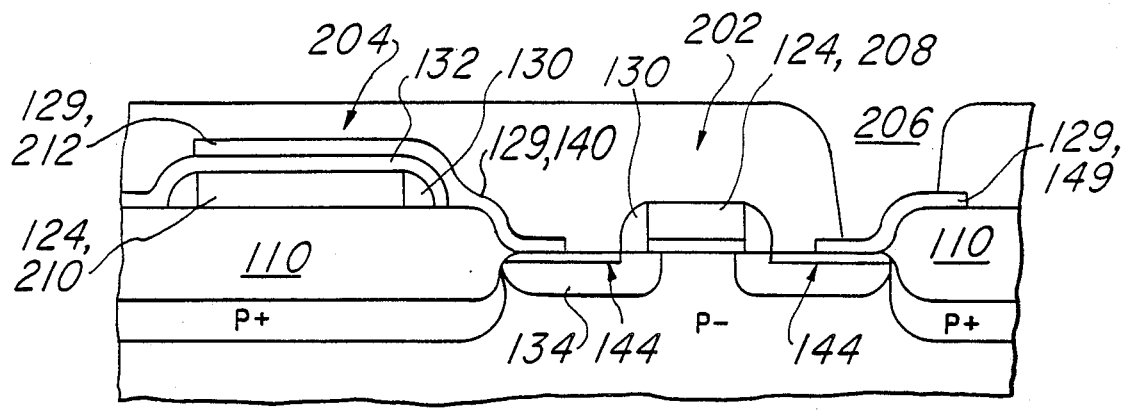
FIG. 2A shows a sample analog circuit including a capacitor having a TiN top plate and a polysilicon bottom plate.
Figure 2B:
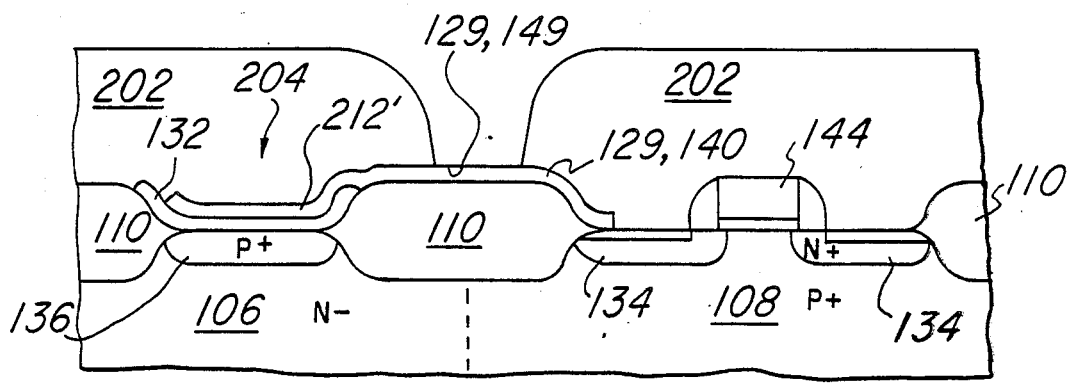
FIG. 2B shows another sample analog circuit including a capacitor having a TiN top plate and a bottom plate in heavily doped silicon substrate (doped with the source/drain implant).
Figure 3:
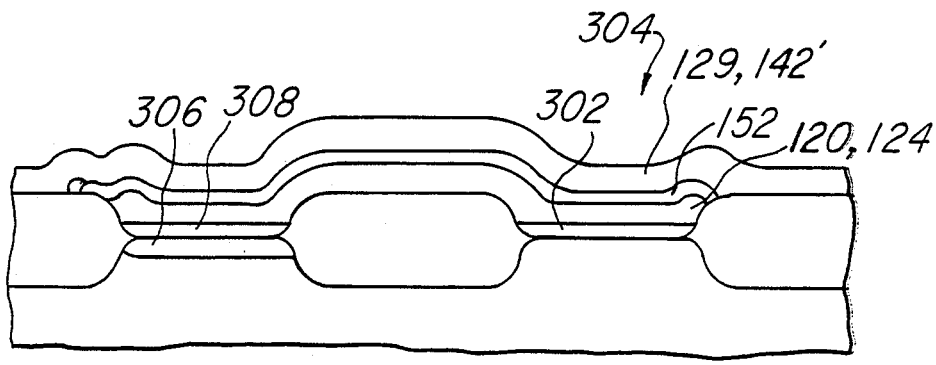
FIG. 3 shows a sample electrically erasable nonvolatile memory cell constructed using only one level of polysilicon.

This process can also be modified to produce an EPROM cell like that shown in FIG. 1C. In this case the source/drains 152 are formed within moat regions patterned in LOCOS field oxide 150 (which may optionally be the same as field oxide 110 used in the periphery), and the source/drains are self-aligned to the stack of floating gate 124 and control gate 142. The buried n+ diffusions for source and drain are not necessary in this type of EPROM.

There are three principal variations in the method for forming the second patterned conductive thin film layer (local interconnect layer) 129 after the patterned interlevel dielectric 132 is in place:

The TiN which is formed during a nitrogen-atmosphere direct-react siliciding process can be patterned and etched.

A cap can be formed over a metallic titanium layer before the anneal which effects silicidation. This is the presently preferred embodiment. The conductive material in the local interconnect lines will be non-stoichiometric TiN (titanium-rich, and with a substantial admixture of oxygen if the cap layer is an oxide), but it will work.

Less preferably, the Ti layer which is to be converted to TiN can be patterned and etched before conversion. This technique could be applied, for example, to the use of TiN as a gate level where Ti is deposited on the gate oxide, patterned, and etched. Subsequent reaction in a nitrogen containing ambient would result in TiN gate electrodes. An advantage of this class of embodiments is that titanium can be etched with very high selectivity to $SiO_2$ (more easily than TiN can). Thus, TiN local interconnect can be formed by forming Ti straps which overlap gate and moat regions, followed by heating in a nitrogen containing ambient to produce TiN connecting the moat and gate regions across the intervening oxide region and TiN/$TiSi_2$ in the regions where the straps cross silicon regions (substrate or polysilicon gates). (This would normally be done after a $TiSi_2$ cladding of the gates and moats, but this is not strictly necessary.)

TiN can be deposited, either by CVD or by sputtering. This is the least preferred method, since it does not provide the convenience of silicide-clad moats and polysilicon, but this method would still enable some of the advantages of the invention.

Additional details regarding implementation of these alternatives will now be described.

A sample process flow is as follows:
After S/D anneal, deposit pure titanium (1000 Å)
Deposit low temperature silicon nitride/silicon dioxide layer (400 Å/800 Å)
Silicide react (675 C, 30 min)
Plasma etch nitride/oxide layer
Selectively strip unreacted titanium (and nitride/oxide filaments) by wet chemical etch
Silicide anneal (800 C, 30 min)
Another sample process flow is as follows:
After S/D anneal, deposit 0.1 μm of pure titanium
Deposit low temperature (300 C) $SiO_2$
Silicide reaction, 675 C for 30 min in $N_2$
Unmasked plasma etch of oxide layer (using a standard fluoro-etch chemistry as commonly used for oxide/nitride etching)
Selective wet strip of Ti reaction products on oxide regions ($H_2O_2$/$H_2SO_4$, or $H_2O_2$/$NH_4OH$ with ultrasonic agitation)
Silicide anneal
Another sample process flow is as follows:
After S/D anneal, deposit 0.1 μm of pure titanium
Deposit low temperature (300 C) $SiO_2$
Silicide reaction, 700 C for 15 sec (transient heating) in $N_2$
Unmasked plasma fluoro-etch of oxide layer
Selective wet strip of Ti reaction products on oxide regions ($H_2O_2$/$H_2SO_4$, or $H_2O_2$/$NH_4OH$ with ultrasonic agitation)
Silicide anneal The cost of this version of the process is an extra 0.1 μm plasma oxide deposition and an unmasked dry etch step. However, the benefit of eliminating the sensitivity of the process to ambient gas contamination, and therefore the improved reproducibility of the process, probably outweighs the disadvantage.

Thus, a patterned local interconnect layer can be obtained by depositing and patterning a thin hardmask *before* the step of reacting the titanium in a nitrogen atmosphere. For example, a 1000 Å layer of plasma oxide (i.e. silicon oxides deposited in a plasma reactor at low temperature, e.g. 300 C, to produce a fairly low density oxide) can be deposited over the titanium metal, etched to mask local interconnects in the desired pattern (using an oxide etch such as $CHF_3 + C_2F_6 + O_2 + He$, which is selective to titanium, so that the titanium layer under the plasma oxide provides an etch stop) and left in place during the reaction which produces TiN and $TiSi_2$ compounds. There will be significant reaction between the titanium metal and the plasma oxide, so that (in one example where rapid thermal annealing was used) Rutherford Backscattering Analysis has revealed that the titanium metal under the plasma oxide layer has an oxygen to titanium atomic ratio of 0.69:1 (as compared to an oxygen to titanium atomic ratio, for titanium which lies on field oxide and is exposed to the nitrogen atmosphere during the reaction step, of around 0.25:1). This high oxygen content is not enough to destroy the metallic conduction properties of the titanium, but does impart substantial resistance to etching ($TiO_2$ is an extremely stable compound which is very difficult to etch). The metallic titanium remaining can be converted to titanium nitrides and/or silicides by a subsequent reaction step. It has been experimentally found that this process does provide a local interconnect with valuable properties including conductivity, etch stop capability, and providing a barrier to lateral diffusion, although the interconnect thus provided is not initially pure TiN, at least where rapid thermal annealing is used for the silicidation (its atomic fraction of nitrogen is much less than 1%, except possibly at the corners of the plasma oxide mask). Note that the plasma oxide mask remains in place through the TiN etching step.

The additional fraction of oxygen introduced by this alternative embodiment can be highly advantageous in at least two ways. First, since $TiO_2$ is so chemically inert, it adds to the durability of the local interconnect layer as an etch stop at contact hole locations. Second, the etching of the TiN layer becomes simpler: a high fraction of oxygen in the layer under the handmask makes it possible to wet etch the TiN without undercutting the hardmask patterned interconnects too much. A sample wet etch for this purpose would be $NH_4OH+$-

H₂O₂ in water at room temperature, but many other wet etch chemistries could be used.

That is, titanium silicide typically gives a rough surface, so it is a pleasant surprise that the titanium under the oxide mask reacts with the oxide mask to form titanium oxides as a surface sealant. This surface TiO₂-rich layer avoids in-migration of etchants during a wet etch and thus permits the simple wet etch process described.

In an alternative version of this embodiment, the plasma oxide hardmask is stripped after the silicidation heating step (the 675 C step in the example given) and before the annealing step (the 800 C step in the example given). By ensuring that a nitrogen atmosphere is present during the high-temperature step, any possibility of silicon and dopant outdiffusion is suppressed, and the remaining metallic titanium which the oxide mask protected from the first heating step will substantially all be converted to nitrides, providing additional diffusion barrier advantages as described above. Another (less preferred) alternative way (for NMOS processes or some CMOS processes with two types of polysilicon) to convert the patterned titanium into a stable conductor is to perform the high-temperature anneal in an atmosphere which does not include nitrogen, so that silicon outdiffusion can convert the titanium metal in the local interconnect straps to titanium silicide.

Note that the oxide hardmask does not strictly have to be stripped at all—optionally it can be left in place through the whole remainder of the process.

A very important advantage of this embodiment is that no TiN etch is required—instead the TiN is simply dipped out using a standard clean-up solution. Thus this embodiment may be the most suitable of all for transfer into a manufacturing environment.

Another advantage of this embodiment is that it is very scalable, since the geometry-limiting step is simply an oxide etch.

After the TiN layer has been patterned as desired, a second annealing step is preferably used to lower the sheet resistance of the silicide layers to one $\Omega/\square$ or less. This second heat treatment step is preferably performed at 800 degrees C for 30 minutes in an argon atmosphere at atmospheric pressure, but these parameters may be varied. For example, the annealing temperature could be in the range of 750 degrees to 875 degrees, or even wider, and the other processing parameters of this step can also be widely varied.

In fact, the silicidation may optionally be performed as a transient heating step, using a flash lamp or laser heating or other transient heating methods. This tends to leave a higher atomic fraction of unreacted titanium in the titanium nitride layers, which as noted may facilitate patterning, and may be disposed of in the later anneal.

After the final anneal which lowers the sheet resistance of the silicide has been performed, processing then proceeds in conventional fashion. For example, an interlevel dielectric could now be deposited, such as 1000 Å of low pressure CVD pad oxide followed by a micron of borophosphosilicate glass. Contact holes would then be cut in the interlevel dielectric and a patterned metal layer formed to achieve a desired pattern of electrical interconnections.

The only modification to subsequent processing which is preferably used is that the contact etch which cuts through the interlevel dielectric is preferably an etch chemistry which will stop on titanium nitride. This means that the titanium nitride layer 22 can be used as a diffusion barrier at the bottom of contacts, and also that the contacts to moat can be allowed to overlap onto the field oxide regions 26, since the titanium nitride 22 will prevent undercutting of exposed portions of field oxide 26 during the contact etch. Normal fluorine-based oxide etch chemistries, such as CF₄ plus 5% O₂, are reasonably selective to TiN.

The polysilicon gate layer so frequently referred to in the present application does not have to be strictly polysilicon, but can be other materials which are substantially polycrystalline or amorphous and contain a large fraction of silicon. For example, deposited silicides or polysilicon/silicide sandwich structures could less preferably be substituted, and future sandwich structures which have analogous deposition and electrical properties in future processes to the place of polysilicon in present processes are intended to be comprehended also.

Similarly, the various gate dielectric and interlevel dielectric layers referred to do not have to be silicon dioxide, silicon nitride, and combinations thereof.

Similarly, the metal layer so frequently referred to as titanium does not have to be strictly pure titanium, but may instead be any one of a wide range of titanium alloys or pseudo-alloys, as long as their chemistry is dominated by titanium; Ti:V and Ti:Al alloys are certainly included here, and other intermetallic compositions such as Ti:Y or Ti:W may also be usable.

It is possible that the teachings of the present invention can be extended to metals other than titanium. In general, any metal which
1. forms a conductive silicide.
2. will not allow silicon diffusion (at temperatures suitable for silicide formation) if the metal is passivated with oxygen and
3. can reduce silicon oxides (at temperatures suitable for silicide formation), is a candidate for use of the present invention. Although titanium is the only metal so far known to optimally meet these requirements and the present invention does give tremendous advantages when used with titanium (or titanium alloys), the teachings of the present invention could be applied to other suitable metals.

In addition, it may also be possible to adapt some of the teachings of the present invention to other "direct-react" processes. That is, other processes where a cladding process is performed by a blanket reaction which forms conductive cladding wherever certain materials are exposed, and provides a useful local interconnect material in other locations, may be adaptable to obtain some of the advantages of the present invention. Some candidates for such adaptation are: deposition and reaction of another refractory metal, (such as tungsten) to form silicides over exposed silicon and leave conductive metal (or a conductive compound, such as a nitride or partially oxidized reaction product) elsewhere. Similarly, it may alternatively be possible to use a gas phase source (such as halides or organometallic compounds) in place of the solid titanium layer used in the preferred embodiment. However, as discussed above, the principal preferred embodiments have tremendous proven advantages, and these modifications are much more conjectural.

As will be appreciated by those skilled in the art, the present invention can be widely modified and varied, and its scope is not limited except as specified in the allowed claims.

What is claimed is:

1. A read/write memory cell formed at a surface of a semiconductor body, comprising:
   a pass transistor, comprising:
      first and second diffused regions at said surface of said semiconductor body, said first diffused region clad with a metal silicide; and
      a gate electrode disposed above a portion of said surface lying between said first and second diffused regions; and
   a storage capacitor, comprising:
      a first plate;
      a storage dielectric disposed adjacent said first plate; and
      a second plate, disposed adjacent said storage dielectric opposing said first plate, said second plate of a material comprising the metal of said metal silicide and in contact with said first diffused region.

2. The memory cell of claim 1, wherein said metal is a refractory metal.

3. The memory cell of claim 1, wherein said metal is titanium.

4. The memory cell of claim 1, wherein said second plate is of a material comprising a conductive compound of said metal of said metal silicide.

5. The memory cell of claim 4, wherein said metal is titanium.

6. The memory cell of claim 5, wherein said material of said second plate comprises titanium nitride.

7. The memory cell of claim 1, further comprising:
   an isolation dielectric adjacent said first diffused region;
   and wherein said first plate is disposed above said isolation dielectric.

8. The memory cell of claim 7, wherein said storage dielectric is disposed above said first plate, and wherein said second plate is disposed above said storage dielectric.

9. The memory cell of claim 7, wherein said isolation dielectric is substantially thicker than said storage dielectric.

10. The memory cell of claim 7, wherein said pass transistor further comprises a gate dielectric underlying said gate electrode;
    and wherein said isolation dielectric has substantially the same thickness as said gate dielectric.

11. A read/write memory cell formed at a surface of a semiconductor body, comprising:
    a pass transistor, comprising:
       first and second diffused regions at said surface of said semiconductor body, said first diffused region clad with a metal silicide formed by the direct reaction of a metal with the surface of said semiconductor body;
       a gate electrode disposed above a portion of said surface lying between said first and second diffused regions; and
    a storage capacitor, comprising:
       a first plate;
       a storage dielectric disposed adjacent said first plate; and
       a second plate, disposed adjacent said storage dielectric opposing said first plate, said second plate formed by removing selected portions of the residual material remaining over said storage dielectric after said direct reaction.

12. The memory cell of claim 11, wherein said gate electrode is a first portion of a patterned layer of polysilicon;
    wherein said first plate of said storage capacitor is a second portion of said patterned layer of polysilicon;
    and wherein said storage dielectric is disposed above said first plate, and wherein said second plate is disposed above said storage dielectric.

13. The memory cell of claim 11, wherein said metal is titanium.

14. The memory cell of claim 11, wherein said residual material comprises a conductive compound of said metal of said metal silicide.

15. The memory cell of claim 14, wherein said metal is titanium.

16. The memory cell of claim 15, wherein said residual material comprises titanium nitride.

17. The memory cell of claim 11, further comprising:
    an isolation dielectric adjacent said first diffused region;
    and wherein said first plate is disposed above said isolation dielectric.

18. The memory cell of claim 17, wherein said storage dielectric is disposed above said first plate, and wherein said second plate is disposed above said storage dielectric.

19. The memory cell of claim 17, wherein said isolation dielectric is substantially thicker than said storage dielectric.

20. The memory cell of claim 17, wherein said pass transistor further comprises a gate dielectric underlying said gate electrode;
    and wherein said isolation dielectric has substantially the same thickness as said gate dielectric.

21. An integrated circuit of the type having read/write memory cells arranged in pairs, wherein each pair of memory cells comprises:
    a first pass transistor, comprising:
       first and second diffused regions at said surface of said semiconductor body, said first diffused region clad with a metal silicide; and
       a gate electrode disposed above a portion of said surface lying between said first and second diffused regions;
    a second pass transistor, comprising
       a third diffused region at said surface of said semiconductor body, said third diffused region clad with said metal silicide; and
       a gate electrode disposed above a portion of said surface lying between said first and third diffused regions;
    a first storage capacitor, comprising:
       a bottom plate;
       a storage dielectric overlying said bottom plate; and
       a top plate, disposed adjacent said storage dielectric opposing said bottom plate, said top plate of a material comprising the metal of said metal silicide and in contact with said first diffused region; and
    a second storage capacitor, comprising:
       a bottom plate;
       a storage dielectric overlying said bottom plate; and
       a top plate, disposed adjacent said storage dielectric opposing said bottom plate, said top plate of a material comprising the metal of said metal silicide and in contact with said third diffused region.

22. The memory device of claim 21, wherein said metal silicide on said first and third diffused region is formed by the direct reaction of a metal with the surface of said semiconductor body.

23. The memory device of claim 22, wherein said top plates are formed by removing selected portions of the residual material remaining over said storage dielectric after said direct reaction.

24. The memory device of claim 23, wherein said metal is titanium.

25. The memory device of claim 24, wherein said residual material is titanium nitride.

26. The memory device of claim 21, wherein said gate electrodes of said transistors and said bottom plates of said first and second storage capacitors are formed by patterning a single layer of polysilicon.

* * * * *